US009099316B2

(12) United States Patent
Steinhoff et al.

(10) Patent No.: US 9,099,316 B2
(45) Date of Patent: Aug. 4, 2015

(54) SINTERED BACKSIDE SHIM IN A PRESS PACK CASSETTE

(71) Applicant: IXYS Corporation, Milpitas, CA (US)

(72) Inventors: Stefan Steinhoff, Somerset (GB); Philip Townsend, Wiltshire (GB)

(73) Assignee: IXYS Corporation, Milpitas, CA (US)

( * ) Notice: Subject to any disclaimer, the term of this patent is extended or adjusted under 35 U.S.C. 154(b) by 15 days.

(21) Appl. No.: 14/054,754

(22) Filed: Oct. 15, 2013

(65) Prior Publication Data

US 2015/0102481 A1 Apr. 16, 2015

(51) Int. Cl.
*H01L 23/051* (2006.01)
*H01L 23/50* (2006.01)
*H01L 23/00* (2006.01)

(52) U.S. Cl.
CPC .............. *H01L 23/051* (2013.01); *H01L 24/72* (2013.01); *H01L 24/90* (2013.01); *H01L 2924/01042* (2013.01); *H01L 2924/01047* (2013.01); *H01L 2924/1203* (2013.01); *H01L 2924/1301* (2013.01); *H01L 2924/1304* (2013.01); *H01L 2924/1305* (2013.01); *H01L 2924/13055* (2013.01)

(58) Field of Classification Search
CPC ....... H01L 23/051; H01L 24/72; H01L 24/90; H01L 2924/02042; H01L 2924/02047; H01L 2924/1203; H01L 2924/1301; H01L 2924/1304; H01L 23/00

USPC ................. 257/700, 701, 758, 727, 728, 726; 361/729, 728, 730, 731

See application file for complete search history.

(56) References Cited

U.S. PATENT DOCUMENTS

| 6,303,974 | B1 | 10/2001 | Irons et al. ..................... 257/584 |
| 6,678,163 | B1 | 1/2004 | Neal et al. ...................... 361/729 |
| 2010/0065389 | A1* | 3/2010 | Gilboy et al. ............. 188/251 R |
| 2013/0043571 | A1* | 2/2013 | Gowda et al. ................. 257/666 |
| 2013/0328204 | A1* | 12/2013 | Zommer ....................... 257/765 |
| 2015/0102383 | A1* | 4/2015 | Golland et al. ............... 257/140 |

* cited by examiner

Primary Examiner — Alexander Oscar Williams
(74) Attorney, Agent, or Firm — Imperium Patent Works; T. Lester Wallace

(57) ABSTRACT

Within a cassette of a press pack module, a conductive shim is bonded to the backside of a device die by a layer of sintered metal. The die, sintered metal, and shim together form a sintered assembly. The cassette is compressed between a metal top plate member and a metal bottom plate member such that the backside of the assembly is pressed against the top plate member, and such that the frontside of the assembly is pressed against another shim. A central portion of the frontside surface of the die is contacted on the bottom by the other shim, but there is no shim contacting a peripheral portion of the frontside surface. Despite there being no shim in contact with the peripheral portion of the frontside surface, the peripheral portion is in good thermal contact with the top plate member through the sintered metal and the bonded conductive shim.

20 Claims, 14 Drawing Sheets

CASSETTE HAVING TWO CONTACT PINS AND AN IGBT DIE (EXPLODED VIEW)

CROSS-SECTIONAL SIDE VIEW OF A CASSETTE ON A PEDESTAL TAKEN ALONG LINE A-A

PRESS PACK MODULE ASSEMBLY
(EXPLODED VIEW)

CASSETTE HAVING TWO CONTACT
PINS AND AN IGBT DIE
(EXPLODED VIEW)

SPRING-LOADED
CONTACT PIN

PEDESTAL LOCATION
WITHIN FRAME
(TOP-DOWN VIEW)

CROSS-SECTIONAL SIDE VIEW OF A CASSETTE ON A
PEDESTAL TAKEN ALONG LINE A-A

CASSETTE HAVING A DIODE DIE

TOP METAL LAYER OF PCB

METAL LAYER 2 OF PCB

METAL LAYER 3 OF PCB

RESISTORS

SINTERED BACKSIDE SHIM IN A PRESS PACK CASSETTE

TECHNICAL FIELD

The described embodiments relate generally to high power semiconductor device modules having cassettes.

BACKGROUND INFORMATION

FIG. 1 (Prior Art) is a sectional perspective diagram of a high power Insulated Gate Bipolar Transistor (IGBT) press pack module 1. The module 1 includes a disc-shaped bottom plate member 2 of nickel-plated copper. The disc-shaped bottom plate member 2 has a set of horizontally-extending channels cut into its upper surface, and also has a set of vertically-extending channels cut into its upper surface. As a result of the perpendicularly intersecting channels cut down into the upper surface, the bottom plate member 2 has an array of upward facing pedestals. When viewed from the top perspective, each pedestal has a substantially square planar upper surface. The bottom surfaces of the channels form a two-dimensional grid-shaped surface at the base level 3 of the pedestals (see FIG. 2). A Printed Circuit Board (PCB) 4 is provided that has a circular outer periphery and is of approximately the same diameter as the disc-shaped bottom plate member 2. The disc-shaped PCB 4 also has a set of substantially square cutouts, where the shape of each cutout corresponds to a corresponding one of the pedestals, so that the disc-shaped PCB 4 can be fit down over the pedestals. When the PCB 4 is fit down over the pedestals and is in place, the bottom surface 5 of the PCB 4 rests on the grid-shaped surface 6 of the bottom plate member 2 at the bottom of the channels. Each pedestal of the bottom plate member 2 sticks up through a corresponding cutout in the PCB 4.

FIG. 2 (Prior Art) is a cross-sectional side-view diagram of one of the pedestals 9 of the bottom plate member 2. The PCB 4 that extends around the pedestal 9 is seen in cross-section. The bottom surface 5 of the PCB is seen to be resting on the grid-shaped surface 6 of the bottom plate member 2 at the base level 3 of the pedestal 9.

FIG. 3 (Prior Art) is an exploded perspective view of a holding assembly 7 sometimes referred to as a "cassette". Cassette 7 includes a four-sided die locator frame 8 made of injection molded insulative plastic. The four-sided frame 8 is open on the bottom and is open on the top so that the frame can fit down over pedestal 9. A silver shim 10 of the cassette assembly fits down into the top of the frame 8 as shown in FIG. 3 and is held in place in the lateral dimension by the frame 8 so that the bottom surface of the silver shim 10 is in contact with the upper square planar surface 11 of the pedestal 9. A first molybdenum shim 12 having a corner cutout fits down onto the upper surface of the silver shim 10. An IGBT die 13 is placed with its frontside 14 down onto the upper surface of the first molybdenum shim 12 so that an emitter contact pad on the frontside 14 of the die 13 is in contact with the top surface of the first molybdenum shim 12. The first molybdenum shim 12 has a corner cutout area so that a spring-loaded contact pin 15 can extend up through the plane of the first molybdenum shim 12 and make contact with a gate contact pad on the downward facing frontside 14 of the IGBT die 13. A second molybdenum shim 16 is placed down onto the backside 17 of the IGBT die 13. The backside of the IGBT die 13 is a metalized collector pad of the IGBT. The second molybdenum shim 16 therefore makes contact with the collector pad of the IGBT die. The stack of shims 10, 12, 16 and the IGBT die 13 is also seen in perspective view in FIG. 2.

One such cassette is fitted over each of the upward extending pedestals of the bottom plate member 2. A disc-shaped top plate member 18 of nickel-plated copper (see FIG. 1) then fits down onto the tops of the cassettes. The flat bottom surface of the top plate member 18 presses down onto the tops of the cassettes, thereby compressing the spring-loaded contact pins of all the cassettes, and forcing good mechanical and electrical contact within each cassette between the bottom of the top plate member, the stack of shims, the IGBT die, and the pedestal of the bottom plate member. Good mechanical and electrical contact is also maintained between the gate pad on the IGBT die, the contact pin, and a metalized track on the top of the PCB 4.

As shown in FIG. 1, the top plate member 18 fits into and is attached to a disc-shaped top lid 19. Top lid 19 is a disc of stamped metal. The top lid 19 and the top plate member 18 may, for example, be brazed together. Likewise, the bottom plate member 2 fits into and is attached to a disc-shaped bottom lid 20. Bottom lid 20 is a disc of stamped metal. The bottom lid 20 and the bottom plate member 2 may, for example, be brazed together. A ceramic collar 21 is attached to the bottom lid 20. A metal flange 26 is attached to the top rim of the ceramic collar 21. During assembly of the press pack module, the top lid/top plate member assembly is pressed down onto the remainder of the press pack module, and the top lid 19 is welded to the flange 26.

The press pack module 1 has a collector terminal 22, an emitter terminal 23, and a gate terminal 24. The collector terminal 22 is an extension of the top lid 19. Within the assembly, the backside collector metal of the IGBTs are electrically coupled through the second molybdenum shims, and through the copper top plate member 18, to the top lid 19. The collector terminal 22 serves as a sensing terminal to the top lid 19. Within the assembly, the frontside emitter pads of the IGBTs are coupled through the first molybdenum shims and the silver shims down to the solid copper bottom plate member 2, and to the bottom lid 20. The emitter terminal 23 serves as a sensing terminal to the bottom lid 20. Within the assembly, the gate pads of the IGBTs are coupled through the spring-loaded contact pins down to a metalized track on the PCB 4, and laterally through the metalized track of the PCB 4 across the module to the inside edge of the ceramic collar, via a clip 25 through a hole in the ceramic collar 21, and to the gate terminal 24. Many IGBT dice may be provided in this way in one press pack module.

Although the cassette is described here as retaining an IGBT die, a cassette can also retain other types of semiconductor dice. A cassette can, for example, contain a diode die. U.S. Pat. No. 6,678,163 discloses a module involving twenty-eight IGBT dice and nine diode dice. The description above of a press pack module is simplified and is presented for background purposes. There are several different variations and types of press pack modules involving cassettes. Rather than using a PCB to provide connection between the gates of the IGBTs and the gate terminal, a preformed insulating insert and stamped copper sheet can be used within the module for gate signal distribution purposes. For additional information on press pack modules and cassettes, see: U.S. Pat. No. 6,678,163 and U.S. Pat. No. 6,303,974 (the subject matter of which are incorporated herein by reference).

SUMMARY

A high power semiconductor device press pack module includes a matrix of cassettes. Each of at least one of the cassettes includes a high power semiconductor device die and two contact pins. Each of these cassettes having contact pins is compressed between a metal top plate member of the module and pedestals of a metal bottom plate member of the module so that four electrical connections are established.

A first electrical connection extends from a first pad (for example, a gate pad) of each semiconductor device die, through one of the contact pins of the cassette that holds the die, and to a first module terminal. Where the first pad is a gate pad of an IGBT die, the IGBT die may include an on-chip resistor between the IGBT gate and the IGBT gate pad.

A second electrical connection extends from a second pad (for example, an emitter pad) of each semiconductor device die, through the other contact pin of the cassette that holds the die, optionally through a resistor, and to a second module terminal. The first module terminal may be a gate terminal of the module. The second module terminal may be an auxiliary emitter terminal of the module.

A third electrical connection extends from a third pad (for example, a collector pad) of each semiconductor device die, through the top metal plate member, and to a top circular contact surface of the module. A third terminal of the module, that serves as a sensing terminal, is also coupled to the upper circular contact surface of the module. Where the die is an IGBT die, the top circular contact surface of the module serves as the main collector terminal of the module.

A fourth electrical connection extends from the second pad (for example, the emitter pad), through the metal bottom plate member, and to a bottom circular contact surface of the module. A fourth terminal of the module, that serves as a sensing terminal, is also coupled to the bottom circular contact surface of the module. Where the die is an IGBT die, the bottom circular contact surface of the module serves as the main emitter terminal of the module.

Accordingly, in a first novel aspect, the high power semiconductor device press pack module includes cassettes and has four module terminals: a collector module terminal, an emitter module terminal, a gate module terminal, and an auxiliary emitter module terminal. Some of the cassettes hold three terminal devices such as IGBTs, whereas others of the cassettes may hold two-terminal devices such as power diodes. In one particular embodiment, each cassette that holds a power IGBT die includes a first molybdenum shim that is in contact with the emitter pad on the frontside of the IGBT die. The auxiliary emitter terminal of the module is coupled to the emitter pad of each IGBT die via a conductive feedthrough that extends through a hole in a ceramic collar of the module, across a multi-layer printed circuit board to a bond pad of the printed circuit board, through a surface mount resistor to another bond pad of the printed circuit board, across the printed circuit board to a contact pad, up through a contact pin of the cassette that holds the IGBT die to a location on the bottom surface of the first molybdenum shim, and through the first molybdenum shim to the emitter pad on the frontside of the IGBT die. The auxiliary emitter terminal is connected to the emitter pad of each IGBT die in parallel in this fashion. The printed circuit board is laid out so that the auxiliary terminal to emitter pad connections are a branched and balanced impedance network. The main current path through the module does not pass through this auxiliary emitter balanced impedance network, but rather extends from the top circuit contact surface of the module (the main collector terminal), downward through a top lid of the module, downward through the top metal plate member, downward through a second molybdenum shim, downward through a layer of sintered silver to the collector pad on the backside of the IGBT die, downward through the IGBT die to the emitter pad on the frontside of the IGBT die, downward through the first molybdenum shim, downward through a silver shim, downward through the bottom metal plate member, downward through a bottom lid of the module, and to the bottom circular contact surface (the main emitter terminal) of the module. The press pack module receives its control signal between the gate module terminal and the auxiliary emitter module terminal (as opposed to between the gate module terminal and the main emitter terminal), so that variations in the reactances between the emitter pads of the individual IGBT dice and the emitter module terminal under high speed and high current turn off conditions do not cause some of the IGBT dice to turn off after others.

In a second novel aspect, the power semiconductor device die in a cassette of a press pack module has a second metal shim bonded to the die backside by a layer of sintered metal. The layer of sintered metal may be a layer of sintered silver microparticles or silver nanoparticles. The die, the layer of sintered metal, and the second metal shim together form a sintered assembly that is assembled first, and is then incorporated into the cassette. The cassette is compressed between a metal top plate member of the module and a metal bottom plate member of the module such that the backside of the sintered assembly is pressed against the metal top member, and such that the frontside of the sintered assembly is pressed against the first metal shim. Within the cassette, a central portion of the frontside surface of the die is contacted by the top of a first metal shim, but there is no shim in contact with the peripheral portion of the frontside surface of the power semiconductor device die. Despite there being no shim in contact with the peripheral portion of the frontside of the die, the peripheral portion of the die is in good thermal contact with the metal top plate member through the layer of sintered metal and through the second metal shim that is bonded to the backside of the die.

The first and second novel aspects described above can be used independently of one another. A press pack module can employ the novel auxiliary emitter terminal without using the novel sintered backside shim attach. Alternatively, the novel sintered backside shim attach can be employed in a press pack module than has no auxiliary emitter terminal.

Further details and embodiments and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings. In this patent document, if a first object is referred to as being disposed "over" or "on" a second object, it is to be understood that the first object can be directly on the second object, or an intervening object may be present between the first and second objects. Similarly, relational terms such as "above", "below", "top", "bottom", "upper" and "lower" are used herein to describe relative orientations between different parts of the structure being described, and it is to be understood that the overall structure being described can actually be oriented in any way in three-dimensional space.

Figure 4:
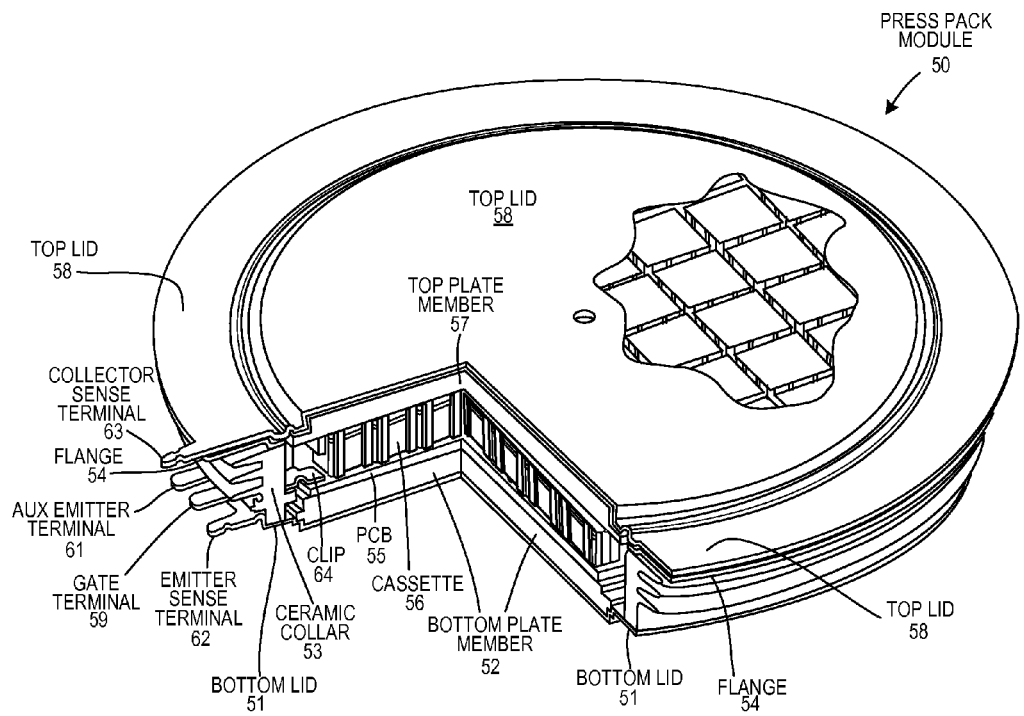
FIG. 4 is a sectional perspective diagram of a high power IGBT press pack module in accordance with one novel aspect.

FIG. 4 is a sectional perspective diagram of a high power Insulated Gate Bipolar Transistor (IGBT) press pack module 50. In a first novel aspect, the module 50 has an auxiliary emitter terminal, where the auxiliary emitter terminal is coupled in parallel by a branched balanced impedance network to a lower shim in contact with the emitter pad of each IGBT of the module 50. A cassette in the press pack module has two contact pins. In one example, one contact pin makes direct physical contact to a first pad on the die of the cassette, whereas the other contact pin makes physical contact with a shim that in turn is in contact with a second pad of the die. In a second novel aspect, within a cassette of the module 50 an upper shim is bonded to the backside of the semiconductor device die with a layer of sintered metal.

In the example of FIG. 4, the branched balanced impedance network provides a highly uniform gate drive signal propagation delay from the package terminal to each individual semiconductor die. The branched balanced impedance network also avoids negative gate voltage feedback due to induced voltages across the emitter power connection self inductances. In addition, the branched balanced impedance network provides high immunity to electrostatic and electromagnetic fields by appropriately designing the PCB board metal layout, particularly, the dimensions of the individual metal contact runners.

Module 50 includes a bottom lid 51 of metal, a disc-shaped bottom plate member 52 of nickel-plated copper, a ceramic collar 53, a collar flange of metal 54, a disc-shaped Printed Circuit Board (PCB) 55, a matrix of cassettes including cassette 56, a disc-shaped top plate member 57, a top lid 58 to metal, a gate terminal 59, a clip 64 and feedthrough connection (not shown) for the gate terminal, an auxiliary emitter terminal 61, and a clip (not shown) and feedthrough (not shown) for the auxiliary emitter terminal 61. The clip and feedthrough connection for the auxiliary emitter terminal 61 are not seen in the particular view of FIG. 4.

The bottom lid 51 is a stamped disc-shape piece of sheet metal. The bottom plate member 52 is a thick, disc-shaped piece of machined nickel-plated copper. The bottom plate member 52 and the bottom lid 51 are shaped to engage one another in a friction fit fashion so that the bottom plate member 52 is fixed to the bottom lid 51. The bottom plate member 52 and the bottom lid 51 may be permanently joined together by brazing. The bottom lid 51 has an extension that forms an emitter terminal 62 of the module. The emitter terminal 62 is typically used for sensing. The main emitter terminal that handles the bulk of current flow is the bottom (downward facing in the illustration) circular contact surface of the bottom lid 51.

Similarly, the top lid 58 is a stamped disc-shaped piece of sheet metal. The top plate member 57 is a thick, disc-shaped piece of machined nickel-plated copper. The top plate member 57 and the top lid 58 are shaped to engage one another in a friction fit fashion so that the top plate member 57 is fixed to the top lid 58. The top plate member 57 and the top lid 58 may be permanently joined together by brazing. The top lid 58 has an extension that forms a collector terminal 63 of the module. The collector terminal 63 is typically used for sensing. The main collector terminal that handles the bulk of current flow is the top (upward facing in the illustration) circular contact surface of the top lid 58.

The disc-shaped bottom plate member 52 has a set of horizontally-extending channels cut into its upper surface, and also has a set of vertically-extending channels cut into its upper surface. As a result of the perpendicularly intersecting channels cut down into the upper surface, the bottom plate member 52 has an array of upward facing pedestals. When viewed from the top perspective, each pedestal has a square upper surface or a substantially square upper surface. The upper surface of the pedestal is planar. The bottom surfaces of the channels form a two-dimensional grid-shaped surface at the base level of the pedestals. The PCB 55 has a circular outer periphery and is of approximately the same diameter as the disc-shaped bottom plate member 52. The disc-shaped PCB 55 has a set of cutouts, where the shape of each cutout corresponds to a corresponding one of the pedestals. Due to the cutouts, the disc-shaped PCB 55 can be fit down over the pedestals. When the PCB 55 is fit down over the pedestals and is in place as seen in FIG. 4, the bottom surface of the PCB 55 rests on the grid-shaped surface of the bottom plate member 52 at the bottom of the channels. Each pedestal of the bottom plate member 52 sticks up through a corresponding cutout in the PCB 55. The PCB 55 is screwed to the bottom plate member 52 to fix it in place. A cassette is disposed on and fits over each of the pedestals. As explained in further detail below, there are two types of cassettes in the particular module 50 of FIG. 4. The first type of cassette contains an IGBT die. The second type of cassette contacts a diode die.

There is a first laterally-extending hole in the ceramic collar 53. A conductive feedthrough (not shown) is provided in this hole. The conductive clip 64 provides an electrical connection between a gate bond pad on the top surface of the PCB 55 and the conductive feedthrough. The gate terminal 59 is connected to the conductive feedthrough on the outside of the ceramic collar 53. There is therefore an electrical connection between the bond pad on the surface of the PCB 55 and the gate terminal 59 on the outside of the module 50.

Likewise, there is a second laterally-extending hole in the ceramic collar 53. A conductive feedthrough (not shown) is provided in this hole. The conductive clip (not shown) for the auxiliary emitter connection provides an electrical connection between an aux emitter bond pad on the top surface of the PCB 55 and the conductive feedthrough. The auxiliary emitter terminal 61 is connected to the conductive feedthrough on the outside of the ceramic collar 53. In the particular perspective view of FIG. 4, only the auxiliary emitter terminal 61 of this connection is in view.

The flange 54 is attached to the upper rim of the ceramic collar 53 and the bottom of the ceramic collar 53 is attached to the bottom lid 51 to have the relation shown in FIG. 4. The PCB 55 is fitted down over the upward projecting pedestals of the bottom plate member 52. A gate signal interconnect network of the PCB 55 is connected, via the clip 64 to the conductive feedthrough (that passes through the ceramic collar) for the gate terminal 59. An auxiliary emitter signal interconnect network of the PCB is connected, via another clip, to the conductive feedthrough (that passes through the ceramic collar) for the auxiliary emitter terminal 61. The cassettes are placed over their respective pedestals. The top lid 58 and top plate member 57 sub-assembly is placed down onto the tops of the cassettes, and is pressed down to compress spring-loaded contact pins within the cassettes. The peripheral edge of the top lid 58 is then welded to the flange 54, thereby securing the cassettes on their pedestals.

Figure 5:
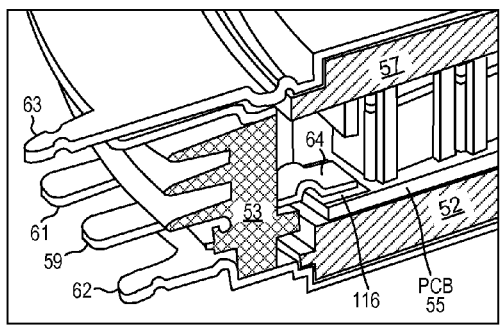
FIG. 5 is a cross-sectional side view showing a cross-section of the ceramic collar at the left of FIG. 4.

FIG. 5 is an expanded view of a part of FIG. 4. The cross-section of the ceramic collar 53 at the left of FIG. 4 is seen in more detail in FIG. 5.

Figure 6:
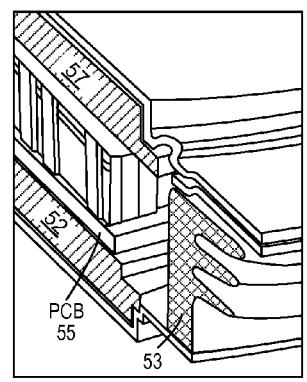
FIG. 6 is a cross-sectional side view showing a cross-section of the ceramic collar at the right of FIG. 4.

FIG. 6 is an expanded view of another part of FIG. 4. The cross-section of the ceramic collar 53 at the right of FIG. 4 is seen in more detail in FIG. 6.

Figure 7:
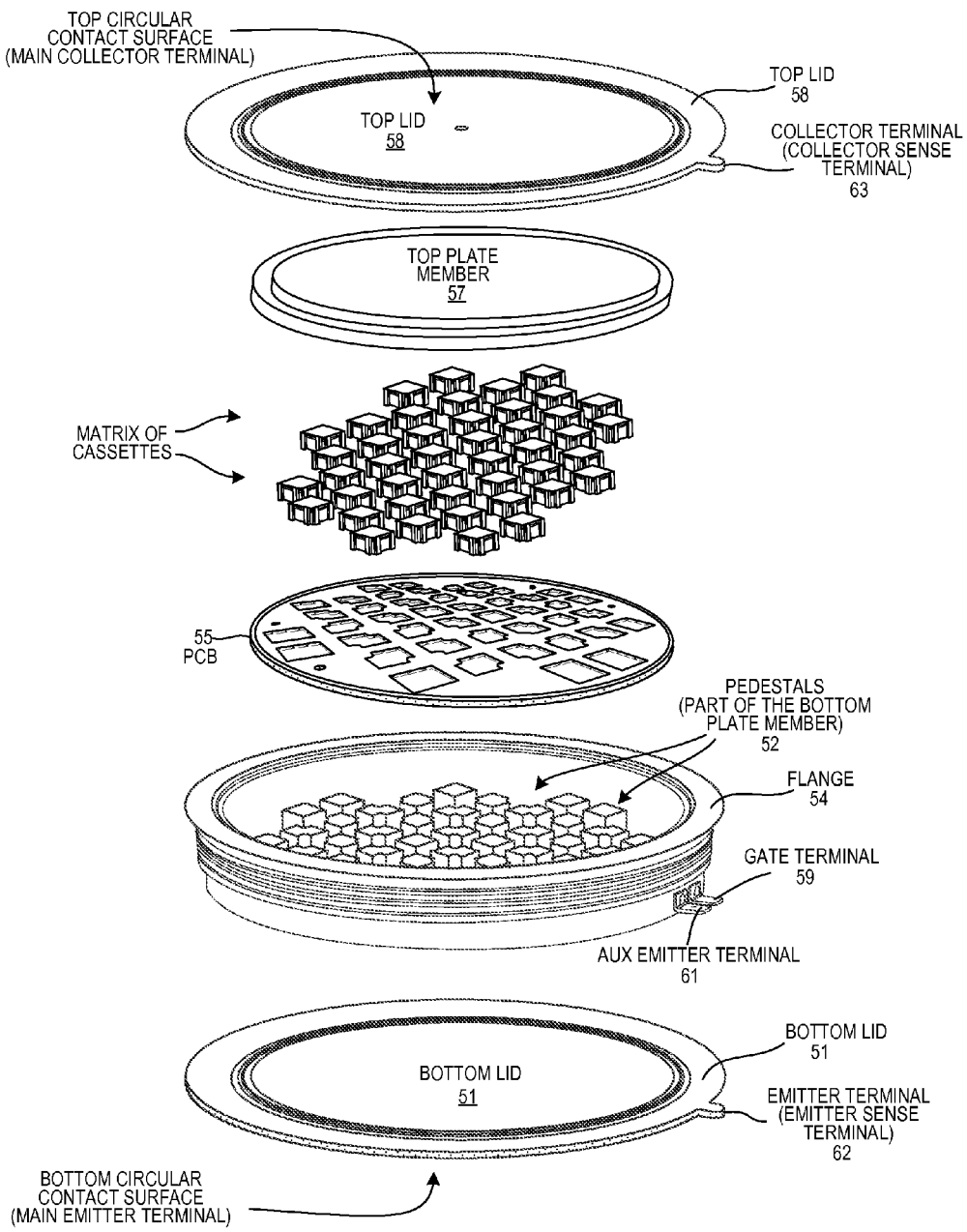
FIG. 7 is a perspective exploded view of the press pack module of FIG. 4.

FIG. 7 is an exploded perspective view of the module 50 of FIG. 4. In FIG. 7, the bottom plate member 52 that includes the pedestals is shown in a sub-assembly along with the ceramic collar 53, flange 54, and terminals 59 and 61.

Figure 8:
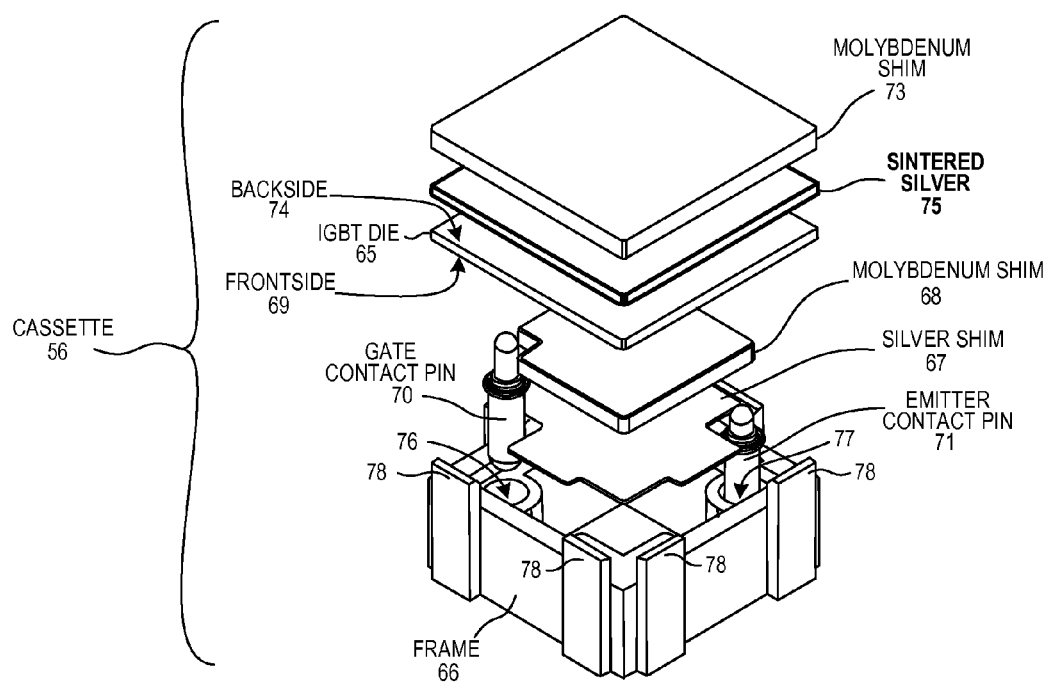
FIG. 8 is a perspective exploded view of a cassette that includes two spring-loaded contact pins in accordance with a first novel aspect.

FIG. 8 is an exploded view of the cassette 56 of FIG. 4. This cassette is of the first type and contains an IGBT die 65. Cassette 56 includes a four-sided die locator frame 66 made of injection molded insulative plastic. The four-sided frame 66 is open on the bottom and is open on the top so that the frame can fit down over a pedestal. A silver shim 67 of the cassette assembly fits down into the top of the frame 66 as shown in FIG. 8. If the frame is not in place of a pedestal, then the edges of the silver shim 67 may rest on ledges on the inside of the frame 66 so that the silver shim does not fall through the opening in the frame. The silver shim 67 is held in place in the lateral dimension by the sides of the frame. When the cassette 56 is in place on a pedestal, the bottom surface of the silver shim 67 is in contact with the upper square planar surface of the pedestal. A first molybdenum shim 68 having a corner cutout fits down onto the upper surface of the silver shim 67. The IGBT die 65 is placed with its frontside 69 down onto the upper surface of the first molybdenum shim 68 so that an emitter contact pad on the frontside 69 of the die 65 is in contact with the top surface of the first molybdenum shim 68. The first molybdenum shim 68 has a corner cutout area so that a first spring-loaded contact pin 70 can extend up through the plane of the first molybdenum shim 68 and make direct contact with a gate contact pad on the downward facing frontside 69 of the IGBT die 65. The first molybdenum shim 68 is smaller than the IGBT die 65, so that a peripheral portion of the downward facing frontside 69 surface of the IGBT die 65 is not touching any shim. A second spring-loaded contact pin 71 makes contact with the first molybdenum shim 68 and through the first molybdenum shim 68 is in electrical contact with the emitter contact pad on the frontside 69 of the IGBT die 65. A second molybdenum shim 73 is bonded to the backside 74 of the IGBT die 65 by a layer of sintered metal 75. In a preferred embodiment, the layer of sintered metal 75 is a layer of sintered silver microparticles or silver nanoparticles. The backside 74 of the IGBT die 65 is a metalized collector pad of the IGBT. The second molybdenum shim 73 is therefore in electrical contact with the collector pad of the IGBT die 65. The first contact pin 70 slides into and is retained by a first cylindrical channel 76 in the frame 66. The second contact pin 71 slides into and is retained by a second cylindrical channel 77 in the frame 66. The frame 66 has upward extending column projections 78 that keep the stack of shims and the IGBT die 65 properly aligned above the top of the pedestal.

Figure 9:
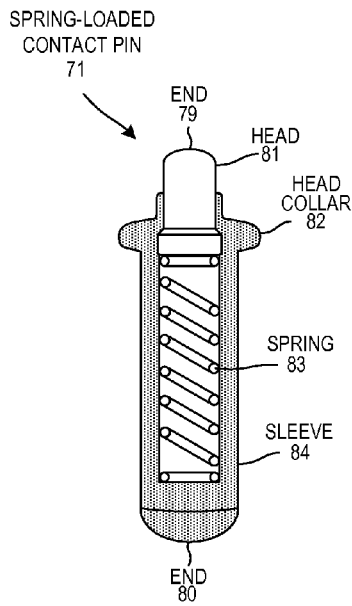
FIG. 9 is a cross-sectional diagram of one of the spring-loaded contact pins of FIG. 8.

FIG. 9 is a cross-sectional diagram of the spring-loaded contact pin 71. The contact pin 71 has a first end 79 and a second end 80. The first end 79 is to make physical contact with the first molybdenum shim 68, and thereby to make electrical contact with the emitter pad of the IGBT. The second end 80 is to make physical contact with a metal contact pad on an upper surface of the PCB 55. The head 81 of the contact pin slidingly engages a head collar 82. If there is no pressure on the head 81, then the head 81 is pushed out to its outer extent by a spring 83. If there is pressure on the head 81, then the head 81 can be pushed into the head collar 82 by compressing the spring 83. The spring 83 is retained by a sleeve 84. The gate contact pin 70 is of the same construction as is emitter contact pin 71, except that the gate contact pin 70 may be made longer by the thickness of the first molybdenum shim 68.

Figure 10:
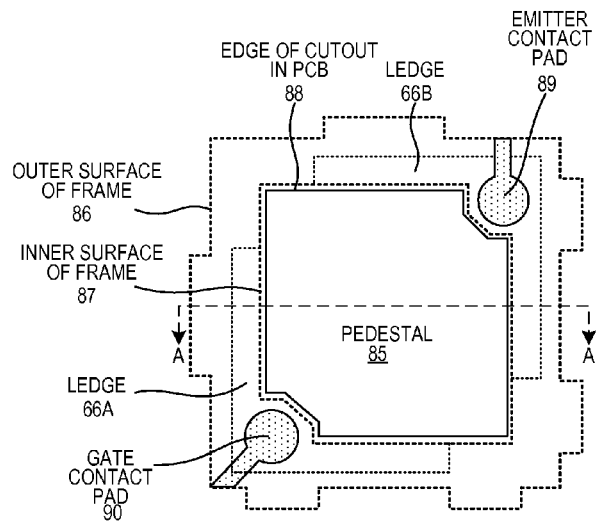
FIG. 10 is a top-down diagram showing the cassette of FIG. 8 disposed on a pedestal.

FIG. 10 is a simplified top-down diagram that illustrates how the cassette 56 of FIG. 8 is fitted onto a pedestal 85. Dashed line 86 identifies the outer surface of the frame 66. Dashed line 87 identifies the inner surface of the frame 66. Reference numerals 66A and 66B identify the ledges upon which the silver shim 67 can rest if the cassette 56 is not in place on a pedestal. The cassette 56 is positioned over the edge 88 of a cutout in the PCB 55 such that the longitudinal axis of the spring-loaded contact pin 71 makes physical contact with a contact pad 89 on the upper surface of the PCB 55. The contact pad 89 is connected via the PCB 55 and series resistors, and a clip, and a conductive feedthrough, to the auxiliary emitter terminal 61. The cassette 56 is positioned such that the longitudinal axis of the spring-loaded contact pin 70 makes physical contact with a contact pad 90 on the upper surface of the PCB 55. The contact pad 90 is connected via the PCB 55, and the clip 64, and a conductive feedthrough, to the gate terminal 59.

Figure 11:
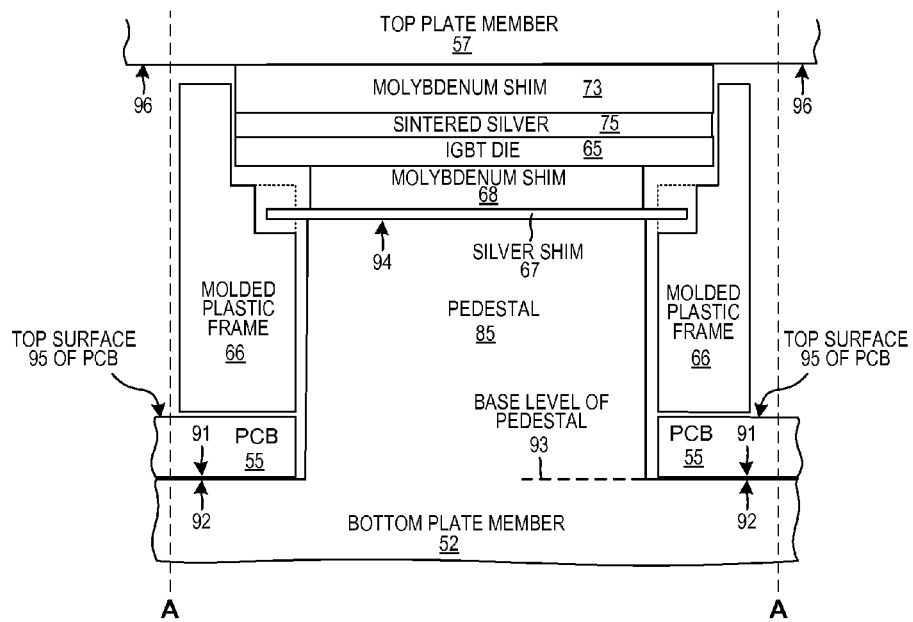
FIG. 11 is a cross-sectional side view taken along line A-A of FIG. 10.

FIG. 11 is a cross-sectional diagram taken along sectional line A-A of FIG. 10. The stack of shims and the IGBT die 65 is compressed between the bottom surface 96 of the top plate member 57 and the planar upper surface 94 of the pedestal 85. The contact pins (not shown in this cross-section A-A) press down on the top surface 95 of the PCB 55. The bottom surface 91 of the PCB 55 is therefore pressed downward onto the grid-shaped surface 92 at the base level 93 of the pedestal 85.

Figure 12:
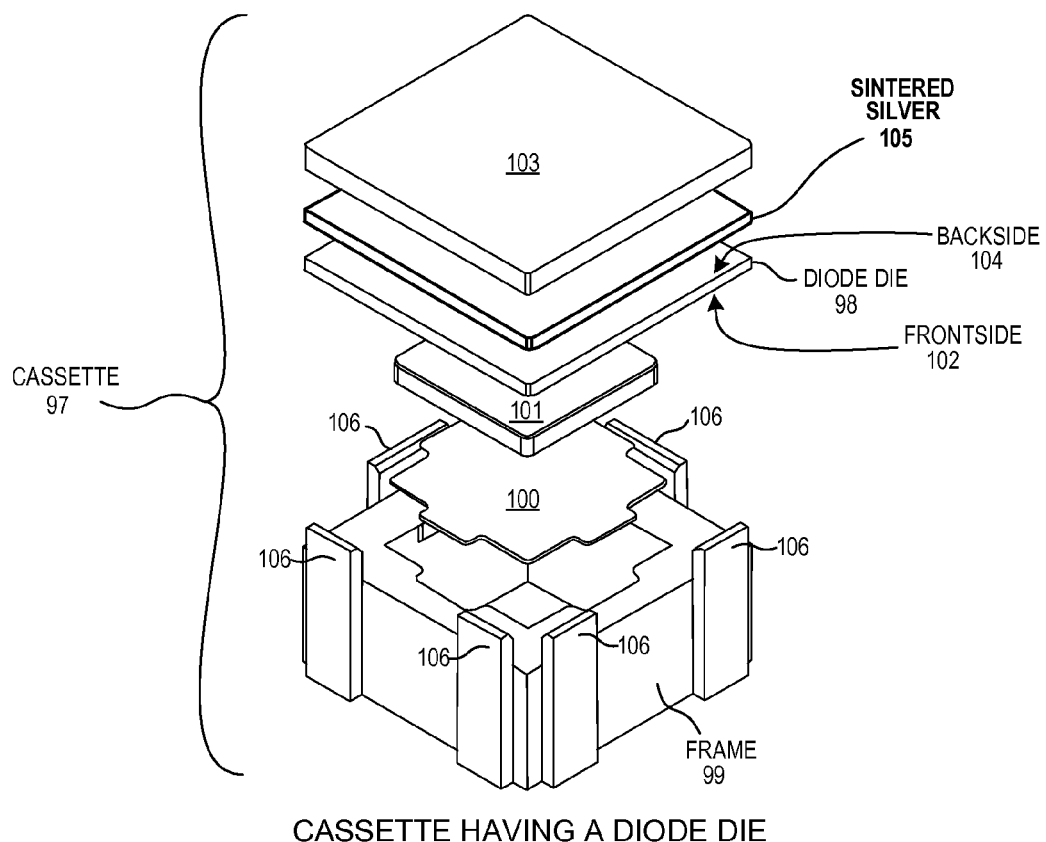
FIG. 12 is a perspective exploded view of a cassette that includes a diode die and no spring-loaded contact pins.

FIG. 12 is an exploded view of a cassette 97 of the second type. Cassette 97 contains a diode die 98. The cassette 97 of FIG. 12 is of similar construction to the cassette 56 of FIG. 8 except that the cassette 97 does not involve contact pins. The frame 99 has no cylindrical channels for retaining contact pins, and the cassette assembly includes no contact pins. A silver shim 100 of the cassette assembly fits down into the top of the frame 99 as shown in FIG. 12 and is held in place in the lateral dimension by the frame 99 so that the bottom surface of the silver shim 100 is in contact with the upper square planar surface of a pedestal. A first molybdenum shim 101 fits down onto the upper surface of the silver shim 100. The diode die 98 is placed with its frontside 102 down onto the upper surface of the first molybdenum shim 101 so that an anode contact pad on the frontside of the die is in contact with the top surface of the first molybdenum shim 101. A second molybdenum shim 103 is bonded to the backside 104 of the diode die 98 by a layer of sintered silver 105. The backside of the diode die 98 is a metalized cathode pad of the diode. The second molybdenum shim 103 is therefore in electrical contact with the cathode pad of the diode die 98. The frame 99 has upward extending column projections 106 that keep the stack of shims and the diode die 98 properly aligned above the top of the pedestal.

Figure 13:
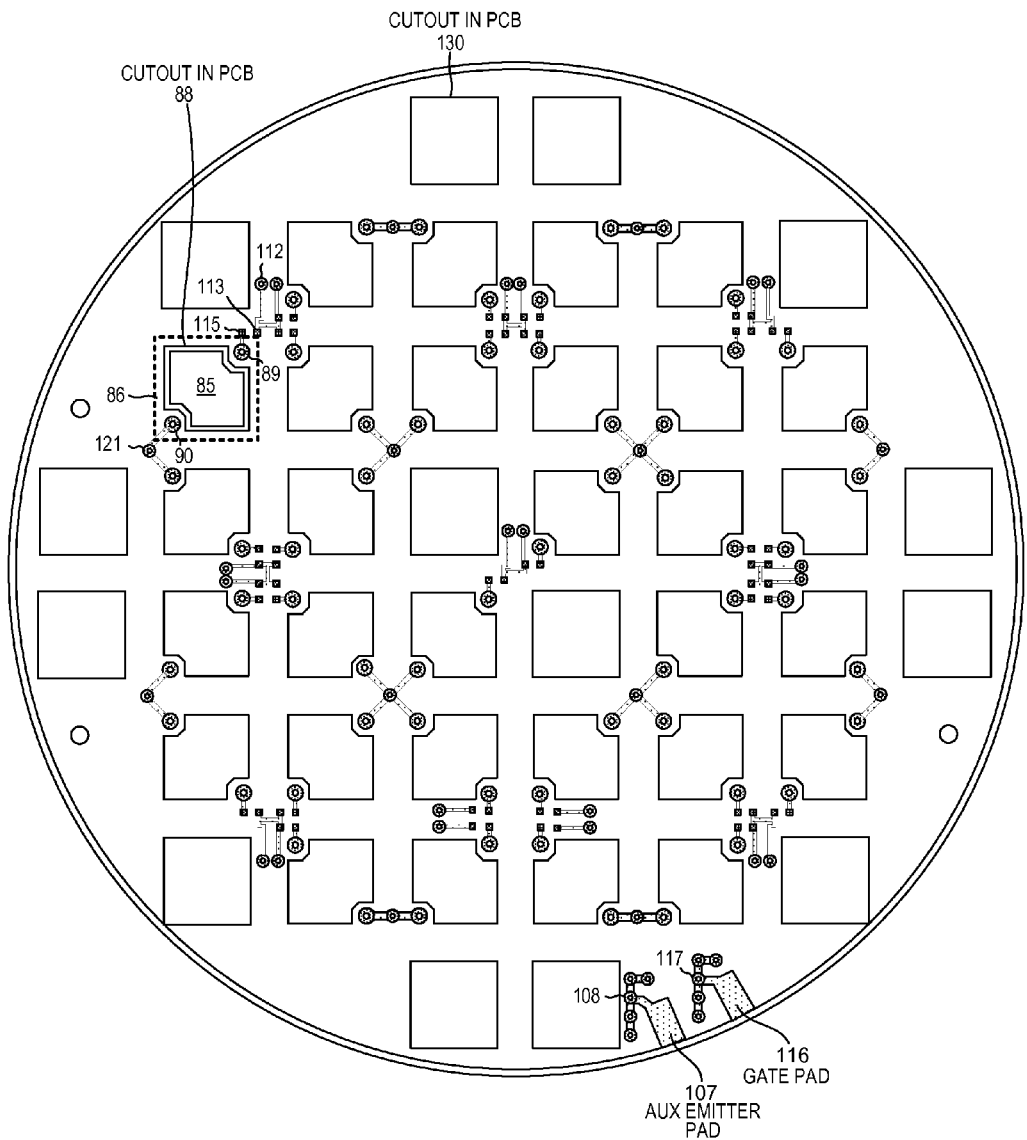
FIG. 13 is a top-down diagram of the top metal layer of the PCB of the module of FIG. 4.
Figure 14:
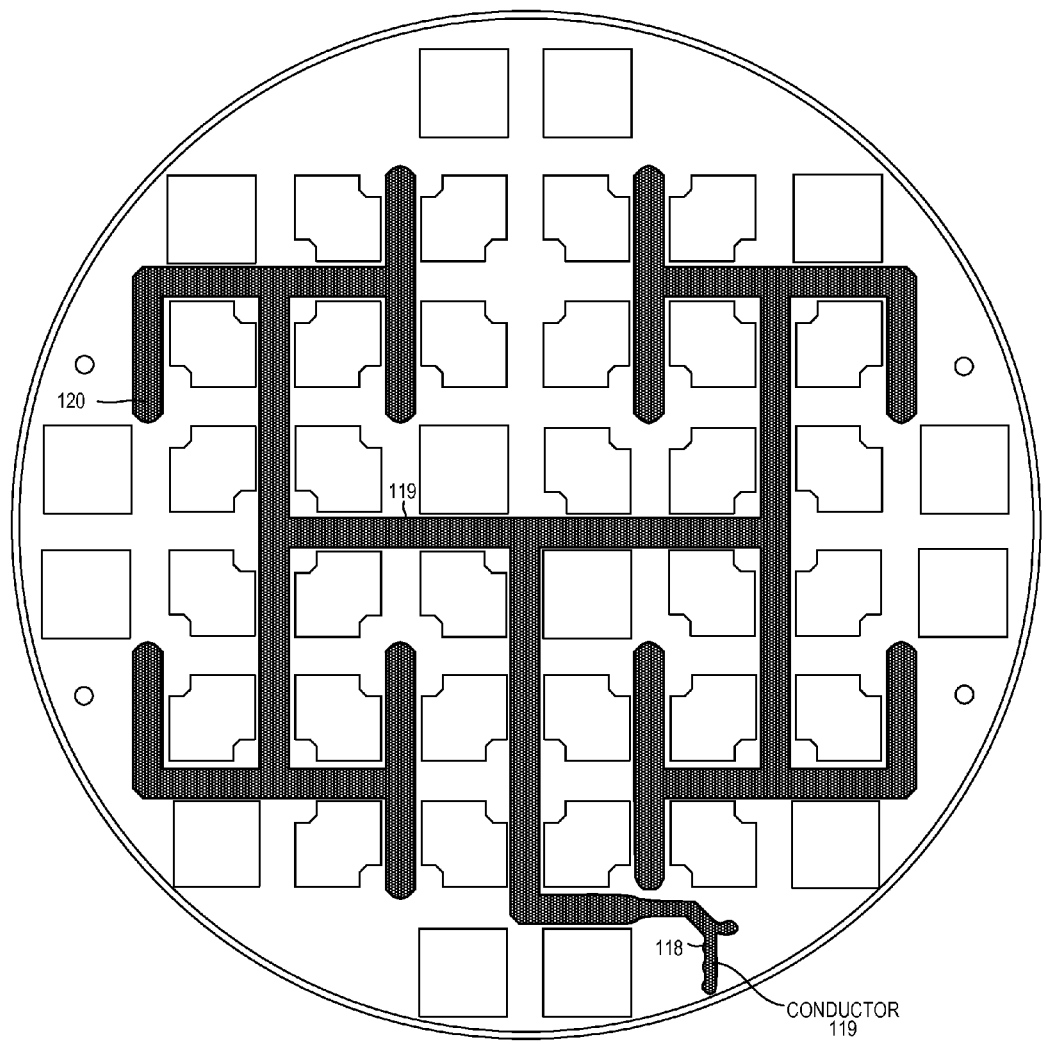
FIG. 14 is a top-down diagram of the second metal layer of the PCB of the module of FIG. 4.
Figure 15:
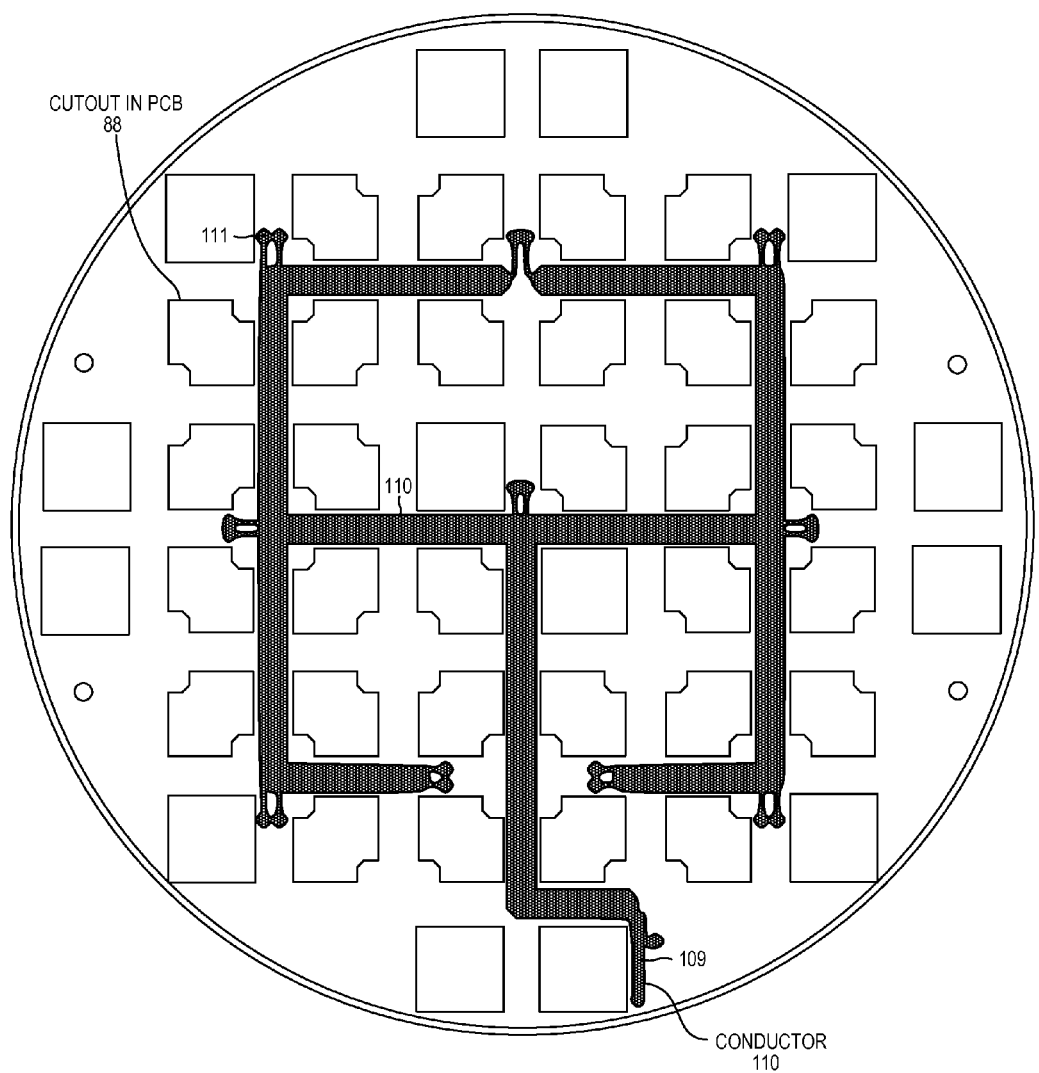
FIG. 15 is a top-down diagram of the third metal layer of the PCB of the module of FIG. 4.
Figure 16:
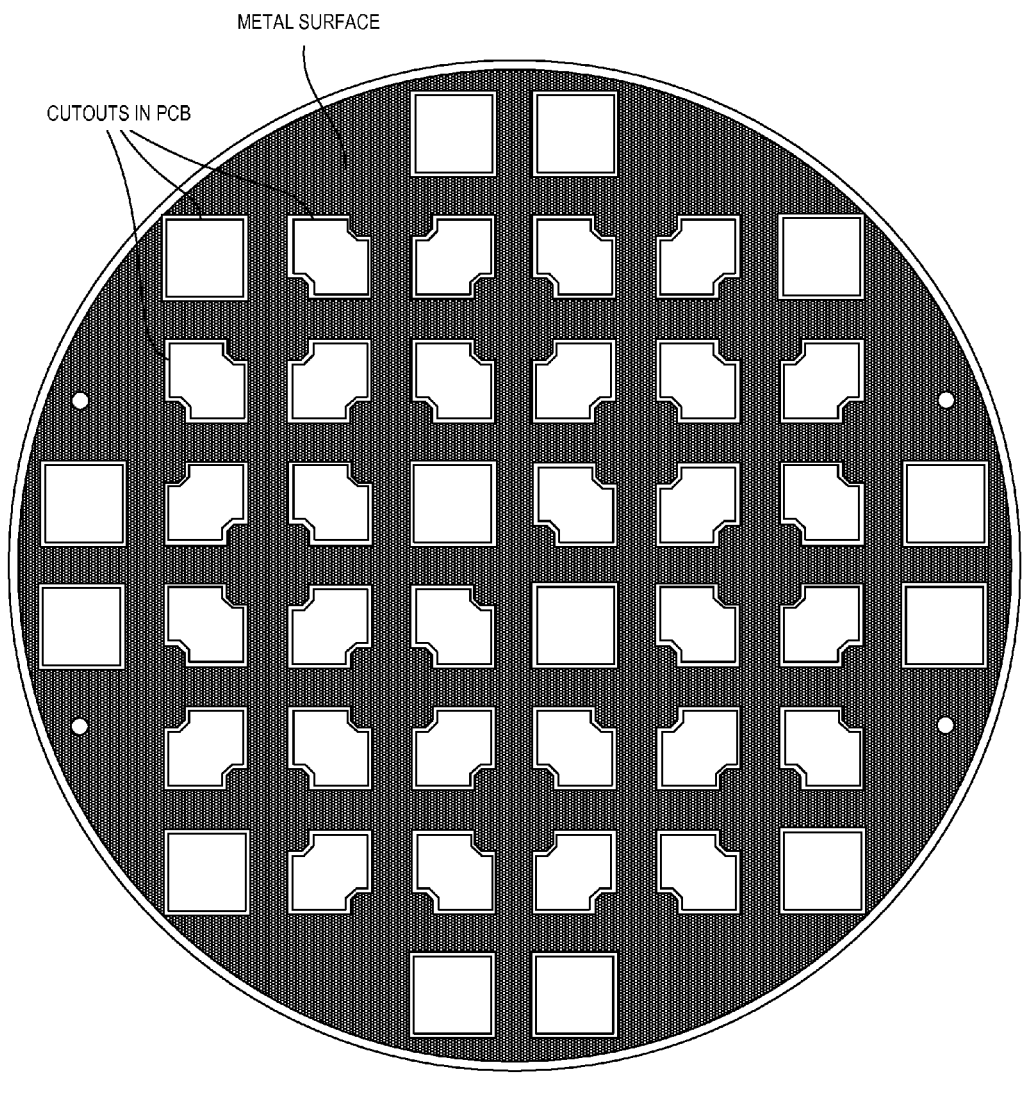
FIG. 16 is a top-down diagram of the bottom metal layer of the PCB of the module of FIG. 4.
Figure 17:
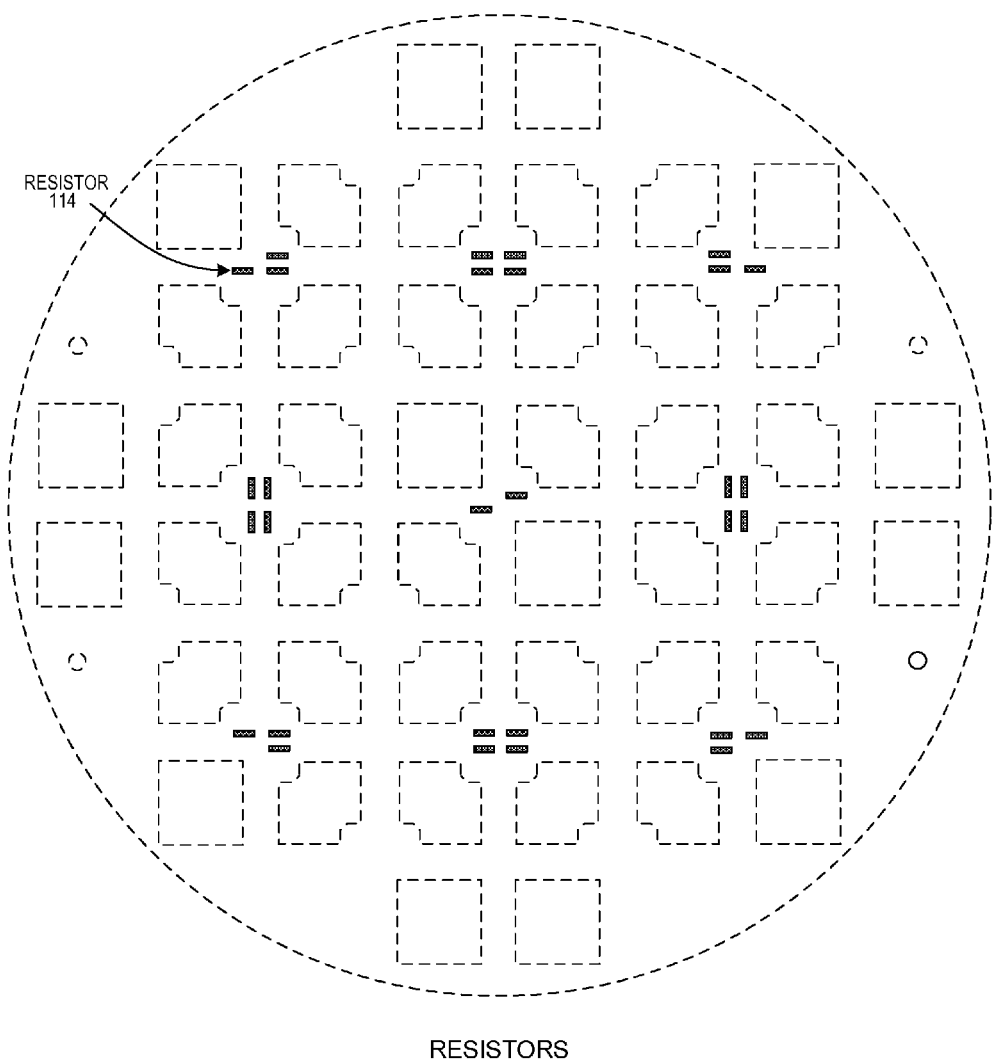
FIG. 17 is a diagram that shows the locations of the resistors in the auxiliary emitter signal distribution network of the module of FIG. 4.

FIG. 13 is a simplified top-down diagram of the top metal layer of the PCB 55. FIG. 14 is a simplified top-down diagram of the metal layer 2 of the PCB 55. FIG. 15 is a simplified top-down diagram of the metal layer 3 of the PCB 55. FIG. 16 is a simplified diagram of the bottom metal layer of PCB 55. FIG. 17 shows where surface mount resistors are mounted to the top layer of the PCB. The surface mount resistors of FIG. 17 are the resistors in the auxiliary emitter balanced network.

In FIG. 13, the dashed line 86 is the same dashed line 86 in FIG. 10 that shows the outer periphery of the frame 66 of the cassette 56 that holds IGBT die 65. Reference numeral 85 identifies the pedestal 85. The cassette 56 is not shown, but the line labeled 86 is provided to show how the cassette 56 is positioned on the pedestal 85. Reference numeral 88 identifies the edge of the cutout in the PCB 55.

A first connection extends from the gate pad 116 on the top of the PCB 55, to pad 117, downward through a conductive via to metal layer 2 of FIG. 14, and from location 118, across conductor 119, to location 120, and back up through a conductive via to a pad 121 on the top of the PCB 55, and then across the top layer of metal to a pad 113, through a surface mount resistor 114 to pad 115, and then across the top layer of metal to the contact pad 90. As explained above, the spring-loaded contact pin 70 of the cassette 56 provides electrical contact from the contact pad 90 up to the gate pad on the IGBT die 65. Within the IGBT die 65, there is an on-chip resistor in the current path to the actual gate of the IGBT. There are many such first electrical connections that extend in parallel from the gate pad 116 on the top of the PCB 55 to the gates of the various IGBT dice in the various cassettes of the module 50. Gate pad 116 on the top of the PCB 55 is shown in the detail of FIG. 5. These first connections to the gates of the IGBTs are provided as an impedance matched balanced network.

A second electrical connection extends from the auxiliary emitter pad 107 on the top of the PCB 55, to pad 108 of FIG. 13, downward through a conductive via to metal layer 3 of FIG. 15, and from location 109, across conductor 110, to location 111, and back up through a conductive via to a pad 112 on the top of the PCB 55, and then across the top layer of metal to a pad 113, through a surface mount resistor 114 to pad 115, and then across the top layer of metal to the contact pad 89. The resistor 114 is shown on FIG. 17. As explained above, the spring-loaded contact pin 71 of the cassette 56 provides electrical contact from the contact pad 89 up to the first molybdenum shim 68 and the emitter pad on the IGBT die 65. There are many such second electrical connections that extend in parallel from the auxiliary emitter pad 107 of the PCB 55, through surface mount resistors, and to the emitters of the various IGBT dice in the various cassettes of the module 50. These second connections are provided as an impedance matched balanced network.

As mentioned above, some of the cassettes include IGBT dice whereas other cassettes include diode dice. In FIG. 13, a cutout, such as cutout 88, that is not entirely square (but rather has two inwardly extending corner regions with contact pads for engaging spring-loaded contact pins) is at a location where a cassette having an IGBT die is disposed. In FIG. 13, a cutout, such as cutout 130, that is entirely square is at a location where a cassette having a diode die is disposed. Accordingly, module 50 of FIG. 4 has thirty IGBT cassettes and fourteen diode cassettes.

Figure 1:
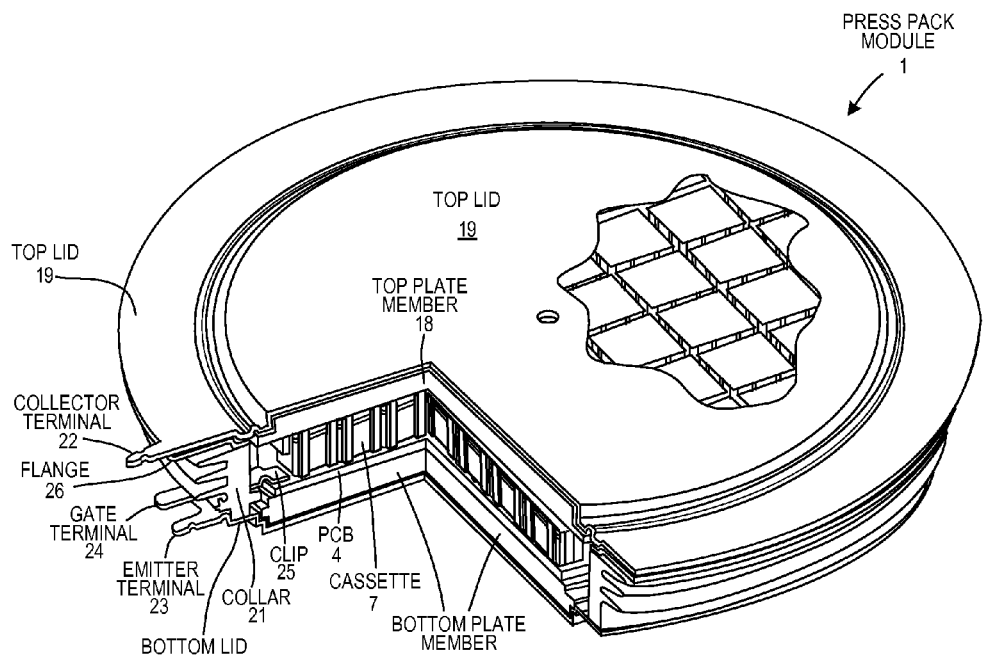
FIG. 1 (Prior Art) is a sectional perspective diagram of a high power IGBT press pack module.
Figure 2:
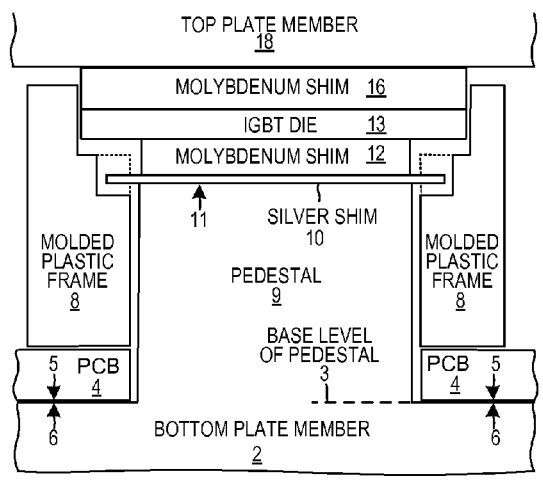
FIG. 2 (Prior Art) is a cross-sectional side view of a cassette in the press pack module of FIG. 1.
Figure 3:
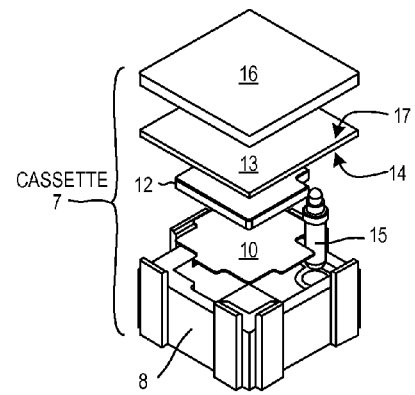
FIG. 3 (Prior Art) is an exploded view of the cassette of FIG. 2.
Figure 18:
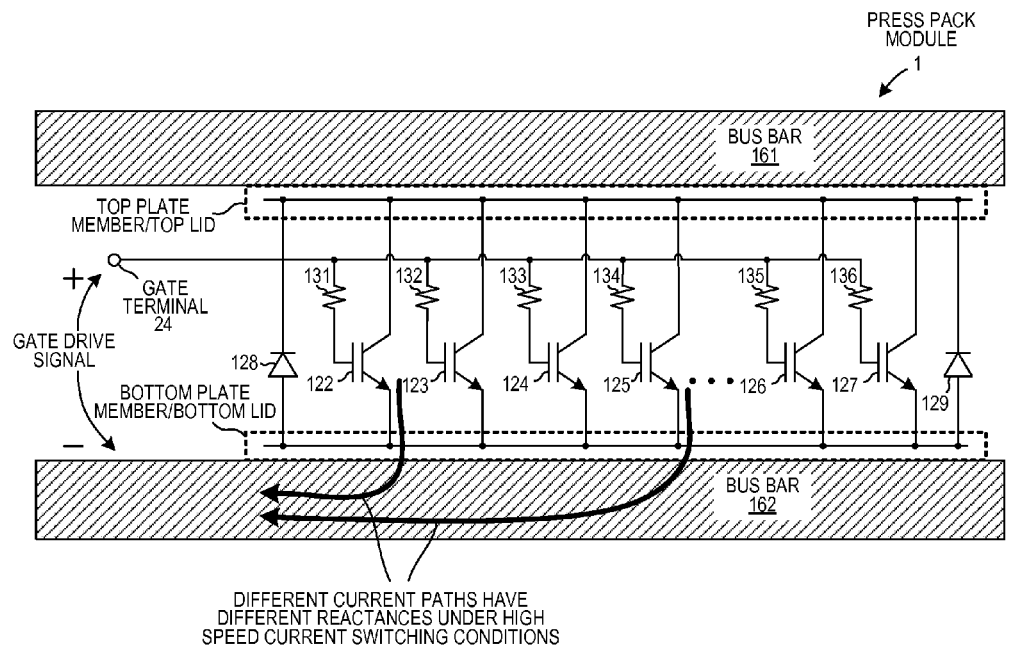
FIG. 18 is a simplified schematic diagram of the IGBTs and diodes of the conventional press pack module of FIG. 1.

FIG. 18 is a simplified schematic of the IGBTs in the press pack module 1 of FIG. 1. The IGBT symbols 122-127 represent the IGBT dice of the module 1 and the diode symbols 128 and 129 represent the diode dice of the module 1. Resistor symbols 131-136 represent on-chip resistors in the gate signal distribution network of the module 1. The module 1 is pressed between two bus bars 161 and 162. The IGBTs of the module 1 are turned on and off together by supplying a gate drive signal between the gate terminal 24 and the bottom circular contact surface of the bottom lid. Although some current flows into the gate terminal 24, the main current path is to the right through the upper bus bar 161, downward through the top circular contact surface of the top plate member/top lid, through the top plate member/top lid, through the IGBTs, through the bottom plate member/bottom lid, out of the bottom circular contact surface of the bottom plate member/bottom lid, through the bus bar 162 back to the left. The module 1 is a very high current device. The module 1 may, for example, be conducting 4000 amperes from the collector terminal to the emitter terminal. The IGBTs are then to be turned off rapidly in, for example, one millisecond. There is some inductance in each current path between an IGBT emitter and the left end of the bus bar 162. The voltage drop across one such inductance can be given as V=LdI/dt, where the L is the inductance. Because the current to be stopped is so large, and because the turn off time is so short, the dI/dt factor is substantial. Even slight differences in the inductances of the emitter current paths (between an IGBT emitter and the end of the bus bar 162) of the various IGBTs give rise to voltage drops across these current paths that may differ by more than 100 millivolts. The resulting slightly different emitter voltages cause some IGBTs to turn off faster than others. Where 4000 amperes is flowing, the last IGBT to turn off may have to turn off too much of this 4000 amperes of current and may fail or be overstressed.

Figure 19:
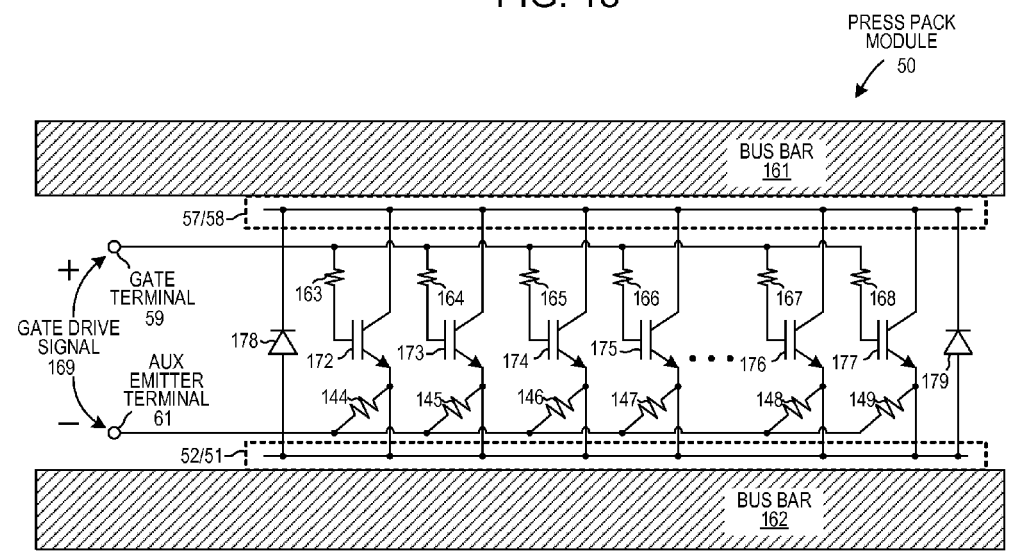
FIG. 19 is a simplified schematic diagram of the IGBTs and the diodes of the novel press pack module of FIG. 4.

FIG. 19 is a simplified schematic of the IGBTs in the module 50 of FIG. 4 in accordance with a first novel aspect. The IGBT symbols 172-177 represent the IGBT dice of the module 50. Diode symbols 178 and 179 represent the diode dice of the module 50. Resistor symbols 144-149 represent the resistors in the auxiliary emitter signal distribution path of the module 50. Resistor symbols 163-168 represent the on-chip resistors to the actual gates of the IGBTs. Rather than turning on and off the IGBTs using a gate drive signal between the gate terminal and the main emitter terminal as in the example of FIG. 18, the IGBTs of the module 50 are turned on and off by supplying a gate drive signal 169 between the gate terminal 59 and the auxiliary emitter terminal 61. The main current path from an emitter of an IGBT, downward through the bottom plate member/bottom lid 52/51, and through the bus bar 162, and to the left end of the bus bar 162 does not pass through the auxiliary emitter spring-loaded contact spring of the cassette, but rather the main current path extends from the emitter pad on the frontside of the IGBT die, downward through the first molybdenum shim, through the silver shim, downward through the pedestal, through the remainder of the bottom plate member 52, through the bottom lid 51, out of the bottom circular contact surface (main emitter terminal) of the module, through the bus bar 162, and to the left end of the bus bar 162. The gate drive signal is applied directly across the gate-to-emitter junctions of the IGBTs through resistors 144-149 so that variations in the voltage drops between the IGBT emitters and the emitter terminal 61 during device turn off has less effect on the $V_{GE}$ signals that control the IGBTs. As compared to the situation described above in connection with FIG. 18, the IGBTs of FIG. 19 see substantially the same gate drive signal voltage between their gate pads and their emitter pads at the time of turn off. As compared to the situation described above in connection with FIG. 18, the IGBTs of FIG. 19 turn off more uniformly at the same time.

Figure 20:
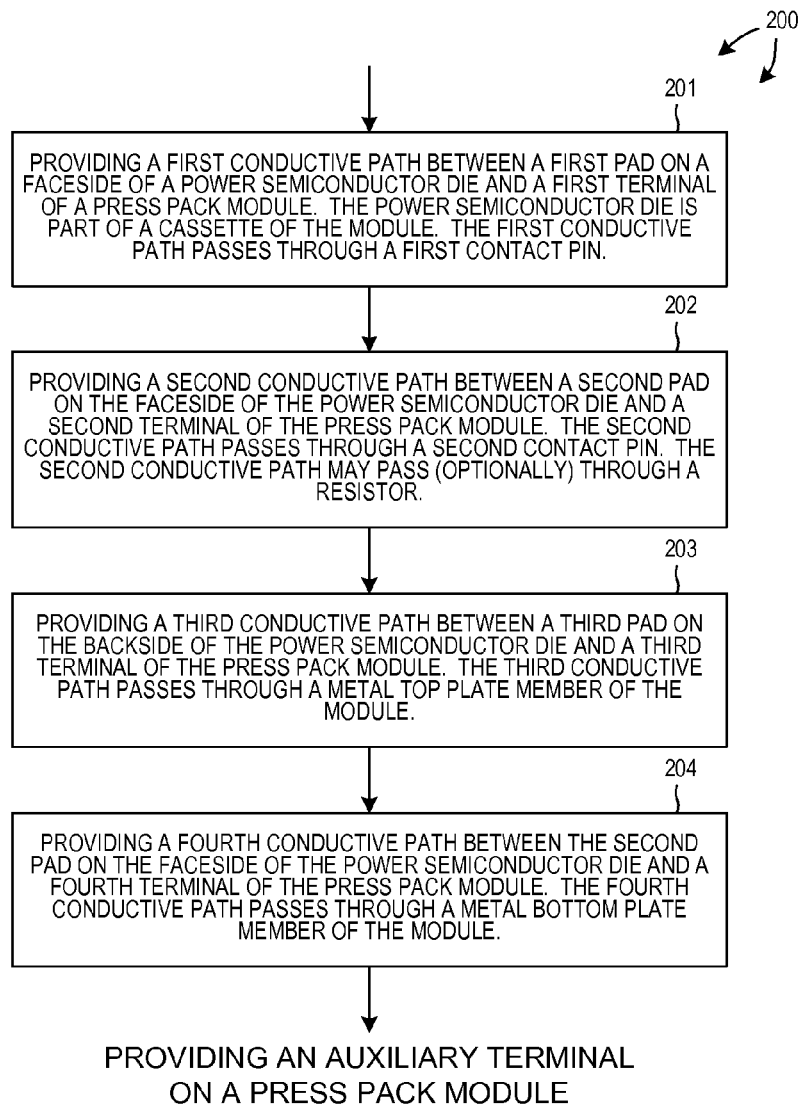
FIG. 20 is a flowchart of a method in accordance with the first novel aspect.

FIG. 20 is a flowchart of a method 200 in accordance with the first novel aspect. A first conductive path is provided (step 201) between a first pad (for example, the gate pad) on the frontside of a power semiconductor die (for example, an IGBT die) and a first terminal (for example, the gate module terminal) of a press pack module. The first conductive path passes through a first contact pin. A second conductive path is provided (step 202) between a second pad (for example, the emitter pad) on the frontside of the power semiconductor die and a second terminal (for example, the auxiliary emitter module terminal) of a press pack module. The second conductive path passes through a second contact pin, and may also pass through a resistor. A third conductive path is provided (step 203) between a third pad (for example, the collector pad) on the backside of the power semiconductor die and a third terminal (for example, the main collector terminal) of the press pack module. The third conductive path passes through the metal top plate member of the module. A fourth conductive path is provided (step 204) between the second pad on the frontside of the die and a fourth terminal (for example, the main emitter terminal) of the press pack module. The fourth conductive path passes through the metal bottom plate member of the module. All the steps are typically performed simultaneously during the assembly of the module. In one example, the first and second contact pins are the spring-loaded contact pins of FIG. 8, and the press pack module is the module of FIG. 4.

Figure 21:
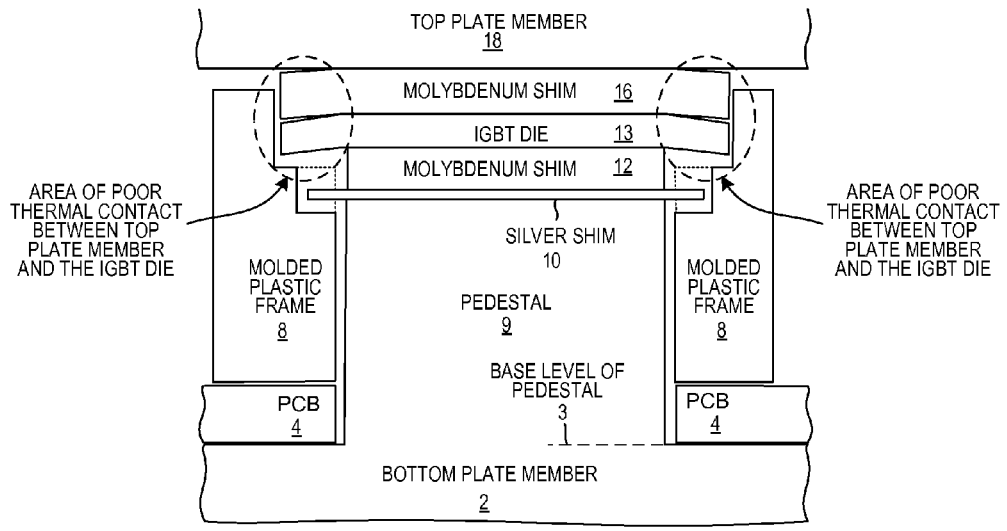
FIG. 21 is a cross-sectional diagram of a cassette on a pedestal in the conventional press pack module of FIG. 1.

FIG. 21 is a simplified cross-sectional diagram of the shim and IGBT die stack within a cassette in the press pack module 1 of FIG. 1. There are voltage protection edge termination structures on the frontside of the IGBT die 13 at the periphery of the die. In a reverse blocking voltage mode when the edge termination structures are protecting the IGBT die from breakdown, there is a very large voltage across these structures. This voltage is typically several thousand volts. A piece of metal disposed along the surface of the edge termination structure would destroy the high voltage protection function of the edge termination and guard ring structures. In addition, unlike the emitter pad that has a relatively thick amount of soft metal on it, the edge termination structures are not covered with such thick layers of metal and are relatively fragile. Also, if mechanical pressure were put on the edge termination structures, then the electric field distribution within the die could be changed and the die would be susceptible to failure. For these reasons, these edge termination structures should not be covered or touched by the molybdenum shim 12. When the top plate member 18 presses down on the stack to compress the stack between the bottom surface of the top plate member 18 and the top of the pedestal 9, there is no part of the first molybdenum shim 12 underneath these peripheral parts of the IGBT die 13. Consequently there is less compressive force on the IGBT die 13 at the die periphery. Due to the lower compressive force, the thermal contact between the IGBT die 13 and the top plate member 18 is not as good at the periphery of the die as it is in the center of the die.

Figure 22:
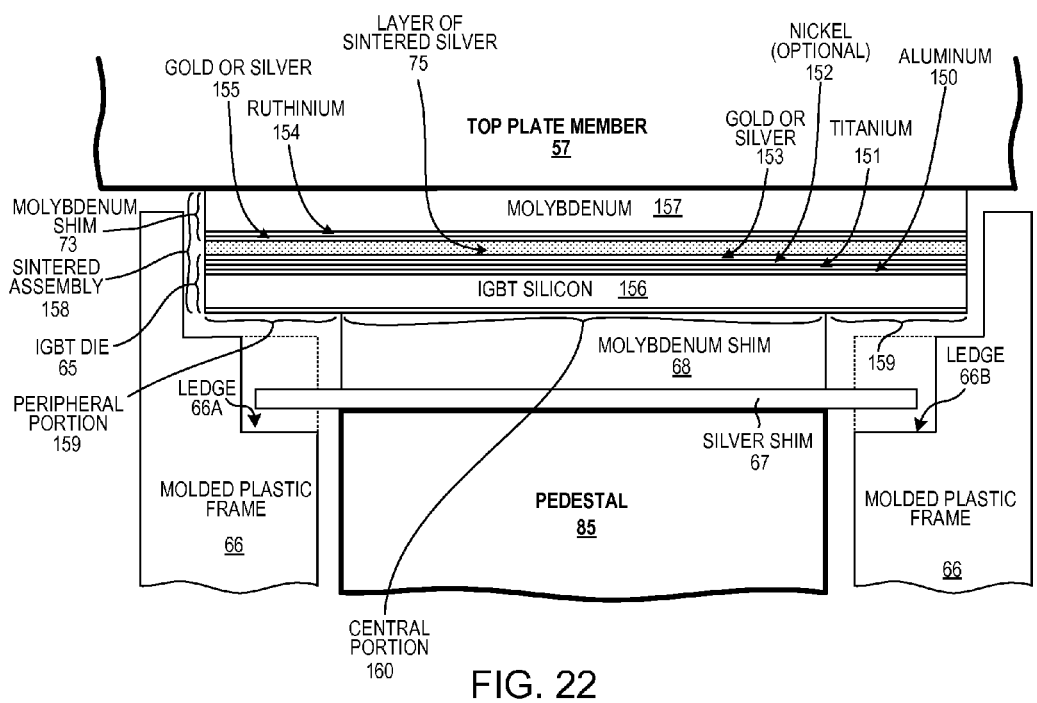
FIG. 22 is a cross-sectional diagram that illustrates how a conductive shim is bonded to the backside of the semiconductor device die with a layer of sintered silver in accordance with the second novel aspect.

FIG. 22 is a more detailed diagram of the how the backside of IGBT die 65 is bonded to the second molybdenum shim 73 by the sintered silver layer 75 in accordance with a second novel aspect. The sintered silver layer 75 provides thermal contact between the peripheral portion 159 of the die 65 and the molybdenum shim 73 even if the two objects are not being pressed together in the cassette. Due to the better thermal contact between the peripheral portion 159 of the die 65 and the molybdenum shim 73, there is better thermal contact to the top plate member 57 as well.

The backside of the die 65 includes an aluminum contact layer 150 to the silicon. The aluminum layer 150 is covered by a diffusion barrier layer 151 (for example, titanium). The diffusion barrier layer 151 is covered by an optional nickel layer 152, which in turn is covered by a gold or silver layer 153. The semiconductor portion 156, and the aluminum layer 150, and the diffusion barrier layer 151, and the nickel layer 152, and the gold or silver layer 153 are referred to together here as the IGBT die 65.

The bottom of the molybdenum shim 73 is actually an undercoat layer 154 (for example, an undercoat layer of ruthenium, nickel, or rhodium, or a combination of them) that is covered by a gold or silver layer 155. The molybdenum portion 157, and the ruthenium layer 154, and the gold or silver layer 155 are referred to together as the second molybdenum shim 73.

Before the die 65 is placed into the frame, the die 65 is bonded to the second molybdenum shim 73 to form a sintered assembly 158. In one example, the surfaces to be joined are cleaned to remove oxides and other contaminants. Wet etching can be employed. In-situ plasma cleaning can be employed in the case where the surface to be cleaned was deposited by PVD sputtering. After cleaning, a layer of commercially available nanoparticle silver paste approximately 40-80 microns thick is applied to one of the cleaned surfaces. The molybdenum shim 73 and the IGBT die 65 are then pressed together under pressure (10-30 MPa) so that the nanoparticle paste is pressed between the cleaned surfaces. The pressed together structure is then heated. As the temperature increases to about 150° C., a thinner component of the paste evaporates. This results in a somewhat more dense packing of the nanoparticles. In the paste, the nanoparticles of silver are coated with a dispersant/binder. At about 200° C., the dispersant/binder coating separates from the silver particles and burns out. After burn out of the organic compounds, the temperature is increased to the higher sintering temperature of 250° C. The sintering 250° C. temperature causes the silver nanoparticles to densify and to sinter together. The silver nanoparticle paste may be a mAgic Paste Microbond paste, series ASP016, ASP043, ASP131 or APA859, that is commercially available from Heraeus Materials Technology GmbH & Co. KG of Hanau, Germany.

In another example, rather than applying silver microparticles or nanoparticles as a paste to the second molybdenum shim 157, the silver microparticles or nanoparticles are commercially available already on a foil. The silver particles on the foil are in a controlled uniform thickness. The silvered foil is placed silver side down on the molybdenum shim 157 with the silver down on the molybdenum, and then the structure is heated and put under some pressure. As a result, the foil can later be easily removed from the silver. With the molybdenum shim silvered in this way, the backside of the die is placed down on the silvered surface of the molybdenum. The die 65 and the molybdenum shim 157 are pressed together under a higher temperature, and the sintering of the layer of silver is completed such that the molybdenum and the IGBT die are bonded together.

To assemble the cassette, shims 67 and 68 are placed into the frame 66. The sintered assembly 158 is then placed into the frame 66 as shown in FIG. 22 to make the completed cassette 56. The cassette is then tested. During handling and testing, the silver shim 67 prevents the first molybdenum shim 68 from falling through the opening in the frame 66. Once the cassette has been tested, the cassette is placed over the pedestal 85 of the bottom plate member. The top plate member 57 is then applied as described above in connection with FIGS. 4-7 to make the completed press pack module 50. The shims 67 and 68 and the sintered assembly 158 are compressed together as a stack between the bottom surface of the top plate member 57 and the upper surface of the pedestal 85 of the bottom plate member 52. The first molybdenum shim 68 contacts the central portion 160 of the die 65 (the emitted pad), but the peripheral portion 159 of the die 65 (where the edge termination structures are) has no part of the first molybdenum shim 68 contacting it from underneath. In a typical example, the peripheral portion 159 is approximately two millimeters wide. Even though the downward facing surface of peripheral portion 159 of the IGBT die 65 has no part of the first molybdenum shim 68 contacting it from underneath, the peripheral portion 159 of the die 65 nevertheless has improved thermal contact with the top plate member 57 as compared to the situation depicted in FIG. 20.

In one example: molybdenum shim 73 is 14.5 mm wide by 1.5 mm thick; IGBT die 65 is 14.3 mm wide by 0.7 mm thick; molybdenum shim 68 is 10.4 mm wide by 1.1 mm wide; silver shim 67 is 12.6 mm wide (max width) by 0.15 mm thick; and pedestal 85 is about 10.55 mm wide by 8.7 mm high. Although the backside silver sintering of a conductive shim onto a die is described here with IGBT die 65 as the example, the same silver sintering attachment process may be applied to the other semiconductor dice of the module 50. For example, the diode dice in the module 50 may also be bonded to their respective shims by silver sintering before they are placed in their frames and incorporated into the module 50.

Figure 23:
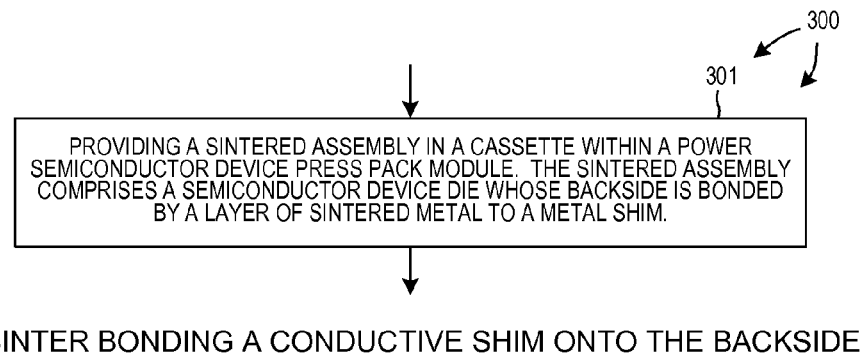
FIG. 23 is a flowchart of a method in accordance with the second novel aspect.

FIG. 23 is a flowchart of a method 300 in accordance with the second novel aspect. A sintered assembly is provided (step 301) in a cassette within a power semiconductor device press pack module. The sintered assembly comprises a semiconductor device die whose backside is bonded by a layer of sintered metal to a metal shim. In one example, the die is the die 65 of FIG. 22, the shim is shim 73 of FIG. 22, and the layer of sintered metal is layer 75 of FIG. 22.

Although the present invention has been described in connection with certain specific embodiments for instructional purposes, the present invention is not limited thereto. The auxiliary terminal described above, and the gate terminal described above, are each just one example of a control module terminal that is connected by a branched balanced impedance network to a corresponding control pad on each of the power devices of a press pack module. Such a terminal and its associated branched balanced impedance network that connects the terminal to pads on semiconductor dice in a press pack module sees general applicability. It can be used for both sensing purposes and well as device driving purposes. Accordingly, various modifications, adaptations, and combinations of various features of the described embodiments can be practiced without departing from the scope of the invention as set forth in the claims.

What is claimed is:

1. A power semiconductor device module, comprising:
a bottom plate member having a plurality of pedestals;
a frame disposed around one of the pedestals;
one or more first metal shims, wherein said one or more first metal shims are stacked onto said one pedestal;
a sintered assembly, wherein the sintered assembly comprises a semiconductor device die that is bonded by a layer of electrically conductive sintered metal to a second metal shim; and
a top plate member, wherein said one or more first metal shims and the sintered assembly are compressed between the top plate member and the pedestal of the bottom plate member.

2. The power semiconductor device module of claim 1, wherein the layer of electrically conductive sintered metal is a layer of sintered silver.

3. The power semiconductor device module of claim 1, wherein the semiconductor device die comprises a metal layer that forms a metalized backside surface of the semiconductor die, and wherein the metalized backside surface of the semiconductor device die is bonded by the conductive sintered metal to the second metal shim, and wherein the second metal shim is in physical contact with the top plate member.

4. The power semiconductor device module of claim 1, wherein said one or more first metal shims comprises a molybdenum shim that is in contact with the semiconductor device die.

5. The power semiconductor device module of claim 1, wherein said one or more first metal shims comprise multiple metal shims, wherein one of said multiple metal shims is in contact with the semiconductor device die, and wherein another of said multiple metal shims is in contact both with the pedestal and with the first metal shim.

6. The power semiconductor device module of claim 1, wherein the semiconductor device die has a frontside and a backside, wherein the backside is bonded by the layer of electrically conductive sintered metal to the second metal shim, wherein the frontside includes a central portion surface and a peripheral portion surface, wherein the central portion surface is in contact with a first metal shim, and wherein the peripheral portion surface is in contact with no metal shim.

7. The power semiconductor device module of claim 1, wherein the layer of electrically conductive sintered metal covers substantially all of the backside of the semiconductor device die.

8. The power semiconductor device module of claim 1, wherein the second metal shim comprises a molybdenum layer.

9. The power semiconductor device module of claim 1, wherein the second metal shim comprises a molybdenum layer and another layer, wherein the other layer is in contact with the layer of electrically conductive sintered metal.

10. The power semiconductor device module of claim 1, wherein the semiconductor device die comprises a device taken from the group consisting of: a power transistor, a power diode, and a power thyristor.

11. A method comprising:
providing a sintered assembly in a cassette within a power semiconductor device module, wherein the sintered assembly comprises a semiconductor device die that is bonded by a layer of electrically conductive sintered metal to a metal shim.

12. The method of claim 11, wherein a portion of a frontside of the sintered assembly is in contact with another metal shim, and wherein a backside of the sintered assembly is in contact with a top plate member of the power semiconductor device module.

13. The method of claim 11, wherein the layer of electrically conductive sintered metal is a layer of sintered silver.

14. The method of claim 11, wherein the cassette comprises an insulative frame that is disposed around a pedestal of a bottom plate member of the power semiconductor device module.

15. A power semiconductor device module, comprising:
    a bottom plate member having a plurality of pedestals;
    one or more first metal shims, wherein said one or more first metal shims are stacked onto one of the pedestals;
    a sintered assembly, wherein the sintered assembly comprises:
        a semiconductor device die;
        a second metal shim; and
        means for bonding the second metal shim to the semiconductor device die; and
    a top plate member, wherein said one or more first metal shims and the sintered assembly are compressed between the top plate member and the pedestal of the bottom plate member.

16. The power semiconductor device module of claim 15, wherein the semiconductor device die has a frontside surface, and wherein no portion of the frontside surface is bonded to any metal shim.

17. The power semiconductor device module of claim 15, wherein a molded plastic frame is disposed around the pedestal.

18. The power semiconductor device module of claim 15, further comprising:
    a spring-loaded contact pin that makes direct physical contact with the sintered assembly.

19. A power semiconductor device module, comprising:
    a bottom plate member having a plurality of pedestals;
    one or more first metal shims, wherein said one or more first metal shims are stacked onto one of the pedestals;
    a sintered assembly, wherein the sintered assembly comprises:
        a semiconductor device die;
        a second metal shim; and
        means for bonding the second metal shim to the semiconductor device die, wherein the means comprises a layer of sintered metal; and
    a top plate member, wherein said one or more first metal shims and the sintered assembly are compressed between the top plate member and the pedestal of the bottom plate member.

20. The power semiconductor device module of claim 15, wherein the semiconductor device die has a frontside surface, wherein the frontside surface has a central portion and a peripheral portion, wherein the central portion of the frontside surface is in contact with a first metal shim but is not bonded to the first metal shim, and wherein no part of the peripheral portion of the frontside surface is in contact with any metal shim.

* * * * *